(12) United States Patent
Kuo et al.

(10) Patent No.: US 10,168,718 B1
(45) Date of Patent: Jan. 1, 2019

(54) DRIVING CONTROLLER CAPABLE OF DYNAMICALLY ADJUSTING VOLTAGE AT CONTROL TERMINAL OF TRANSISTOR

(71) Applicant: WELTREND SEMICONDUCTOR INC., Hsinchu (TW)

(72) Inventors: Ming-Ying Kuo, Hsinchu (TW); Chun-Teh Chen, Hsinchu (TW); Chia-Pauo Wu, Hsinchu (TW)

(73) Assignee: WELTREND SEMICONDUCTOR INC., Hsinchu (TW)

( * ) Notice: Subject to any disclaimer, the term of this patent is extended or adjusted under 35 U.S.C. 154(b) by 0 days.

(21) Appl. No.: 16/036,889

(22) Filed: Jul. 16, 2018

(30) Foreign Application Priority Data

Jul. 25, 2017 (TW) .............................. 106124867 A

(51) Int. Cl.
| | |
|---|---|
| *H02M 1/08* | (2006.01) |
| *H03K 17/0412* | (2006.01) |
| *G05F 1/563* | (2006.01) |
| *H02M 1/42* | (2007.01) |
| *H02M 7/04* | (2006.01) |
| *G05F 1/577* | (2006.01) |

(52) U.S. Cl.
CPC .............. *G05F 1/563* (2013.01); *G05F 1/577* (2013.01); *H02M 1/42* (2013.01); *H02M 7/04* (2013.01)

(58) Field of Classification Search
CPC ...... G05F 1/562; H02M 1/08; H03K 17/0412; H03K 17/04126
USPC .................................. 323/274, 275, 284, 289
See application file for complete search history.

(56) References Cited

U.S. PATENT DOCUMENTS

| | | | | |
|---|---|---|---|---|
| 5,883,505 | A * | 3/1999 | Magazzu' ................... | G05F 1/62 323/282 |
| 6,680,837 | B1 * | 1/2004 | Buxton ................... | H02H 3/087 327/309 |
| 7,893,672 | B2 * | 2/2011 | Scoones ..................... | G05F 1/56 323/280 |
| 2010/0259235 | A1 | 10/2010 | Ozalevli | |
| 2011/0241738 | A1 * | 10/2011 | Tamaoka ................ | H02M 1/08 327/109 |
| 2013/0188289 | A1 | 7/2013 | Misawa | |
| 2013/0285630 | A1 | 10/2013 | Wang | |
| 2017/0110979 | A1 * | 4/2017 | Chang ................ | H05B 33/0827 |

FOREIGN PATENT DOCUMENTS

TW     I559113 B    11/2016

* cited by examiner

*Primary Examiner* — Gary Nash
(74) *Attorney, Agent, or Firm* — Winston Hsu

(57) ABSTRACT

A driving controller for driving a transistor, includes an operation unit, a first adjustment unit, a second adjustment unit, a first comparator, a comparison unit. A first terminal of the transistor receives an operation voltage. The operation unit is coupled to a control terminal of the transistor. The first adjustment unit is used to increase a voltage of the control terminal of the transistor. The second adjustment unit is used to decrease the voltage of the control terminal of the transistor. The first comparator and the comparison unit are coupled to the first terminal of the transistor and used to compare the operation voltage with a first reference voltage to a third reference voltage respectively so that the transistor may be controlled accordingly.

15 Claims, 4 Drawing Sheets

DRIVING CONTROLLER CAPABLE OF DYNAMICALLY ADJUSTING VOLTAGE AT CONTROL TERMINAL OF TRANSISTOR

BACKGROUND OF THE INVENTION

1. Field of the Invention

The present application relates to a driving controller, and more particularly, a driving controller used for dynamically adjusting a voltage at a control terminal of a transistor so as to reduce conduction loss of a power switch.

2. Description of the Prior Art

In an electrical power conversion driving controller (e.g. a flyback circuit), a diode can be used as a rectification component. For example, a Schottky diode can be used because it has a lower forward voltage. However, power loss may be an issue. For example, when a voltage across a diode is 0.5 volts, and a root mean square of a current flowing through the diode is 10 amps, the power loss would be a product of the current and the voltage, which is 5 watts.

For reducing the power loss, a transistor may be used to replace a diode. For example, two terminals (e.g. a drain terminal and a source terminal) of a metal-oxide-semiconductor field-effect transistor (MOSFET) can be used to replace an anode and a cathode of a diode. After replacing the diode, if resistance of an enabled transistor is 10 mΩ, and a current flowing through the transistor is still 10 amps, the power loss would be a product of the resistance and the square of the current, which is 1 watt. The abovementioned values are merely examples. In this example, power loss may be reduced from 5 watts to 1 watt, so the power loss would be decreased using a transistor instead of a diode to be a rectification component in an electrical power conversion driving controller.

However, when the voltage across a transistor is converted to a forward voltage, the current may flow through a parasitic body diode within the transistor. A forward voltage across the body diode is larger than a forward voltage of the foresaid diode and is as high as 0.7 volts. This further increases the power loss. Hence, if the turning on and off of the transistor cannot be controlled properly, the power loss is increased further. Because of this, when the voltage across the transistor is close to 0 volts, the transistor can be turned off to reduce the conduction of the body diode so as to reduce the power loss. However, if the transistor is turned off too early, the transistor cannot properly reduce power loss.

For reducing the power loss, a transistor with a lower on-resistance can be intuitively selected, but it is difficult to improve the effect without adjusting the operation method. FIG. 1 illustrates a waveform diagram of a driving controller according to prior art. In FIG. 1, the operation current ID is a current flowing through a transistor. The operation VDS is a voltage across the transistor. The voltage Vdrv is a voltage at the control terminal of the transistor. The curve 181 corresponds to a transistor with a higher on-resistance, and the curve 182 corresponds to a transistor with a lower on-resistance. The voltage Voff is a threshold to be compared with the operation voltage VDS to accordingly turn off the transistor. As shown in FIG. 1, when using a transistor with a lower on-resistance, the curve of the operation voltage VDS will change from the curve 181 to the curve 182 corresponding to the same operation current ID. Hence, the time point of turning off the transistor can be changed from the time point t1 to the time point t2. Since the transistor is turned off earlier, the effect of reducing the power loss is worsened.

According to FIG. 1, when turning off the transistor, the voltage Vdrv at the control terminal of the transistor is pulled down from a maximum voltage, so it is difficult to shorten the turn-off delay time, and the operation may slow down the turning off of the circuit.

SUMMARY OF THE INVENTION

An embodiment discloses a driving controller for driving a transistor. The transistor includes a first terminal for receiving an operation voltage, a second terminal and a control terminal. The driving controller includes a first operation unit, a first adjustment unit, a second adjustment unit, a first comparator and a comparison unit. The first operation unit includes a first terminal for receiving a first voltage, a control terminal, and a second terminal coupled to the control terminal of the transistor. The first adjustment unit is coupled to the control terminal of the transistor and used to increase a voltage at the control terminal of the transistor. The second adjustment unit is coupled to the control terminal of the transistor and used to decrease the voltage at the control terminal of the transistor. The first comparator includes a first terminal coupled to the first terminal of the transistor, a second terminal for receiving a first reference voltage, and an output terminal for outputting a first comparison signal when the operation voltage is equal to the first reference voltage. The comparison unit includes a first terminal coupled to the first terminal of the transistor to receive the operation voltage, and a set of output terminals. The comparison unit is used to compare the operation voltage and a second reference voltage and compare the operation voltage and a third reference voltage. The set of output terminals outputs a second comparison signal when the operation voltage is equal to the second reference voltage. The set of output terminals outputs a third comparison signal when the operation voltage is equal to the third reference voltage.

Another embodiment discloses a control method for a driving controller. The driving controller is used to drive a transistor. The transistor includes a first terminal for receiving an operation voltage. The driving controller includes a first operation unit coupled between a control terminal of the transistor and a first voltage terminal providing a first voltage, a first adjustment unit coupled to the control terminal of the transistor, and a second adjustment unit coupled to the control terminal of the transistor. The control method includes turning on the first operation unit to increase a voltage at the control terminal of the transistor to turn on the transistor when the operation voltage decreases to a first reference voltage; turning off the first operation unit and turning on the second adjustment unit for the second adjustment unit to decrease the voltage at the control terminal of the transistor when the operation voltage increases to a second reference voltage; and turning off the second adjustment unit and turning on the first adjustment unit for the first adjustment unit to increase the voltage at the control terminal of the transistor when the operation voltage decreases to a third reference voltage. The first adjustment unit and the second adjustment unit are not turned on concurrently, the first reference voltage is lower than the third reference voltage, and the third reference voltage is lower than the second reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
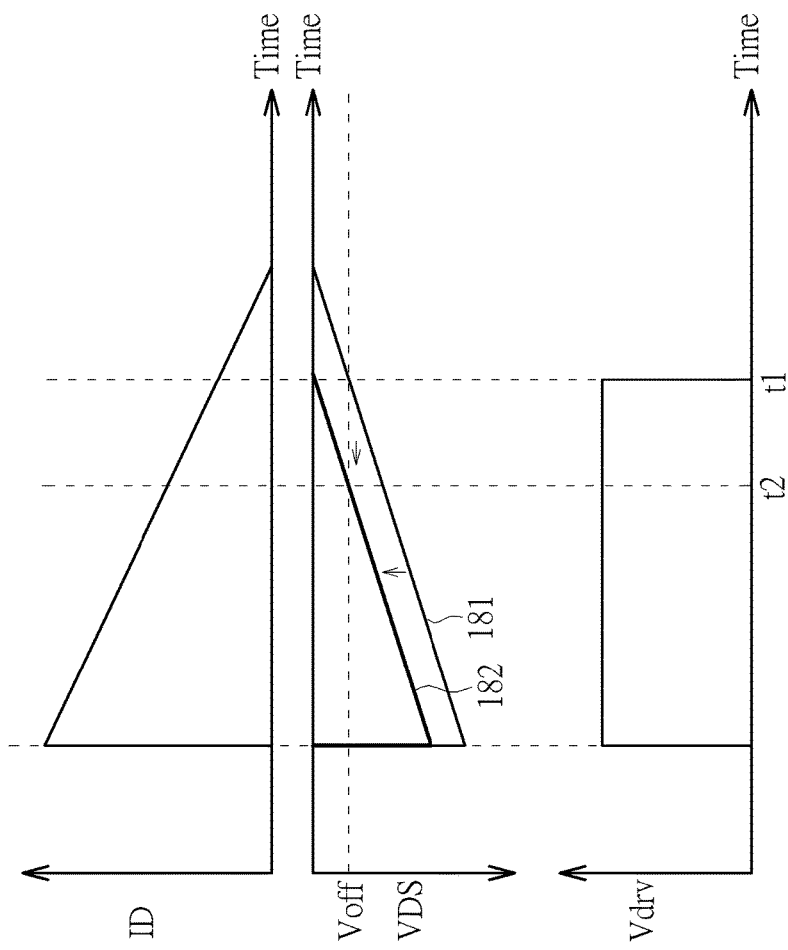
FIG. 1 illustrates a waveform diagram of a driving controller according to prior art.
Figure 2:
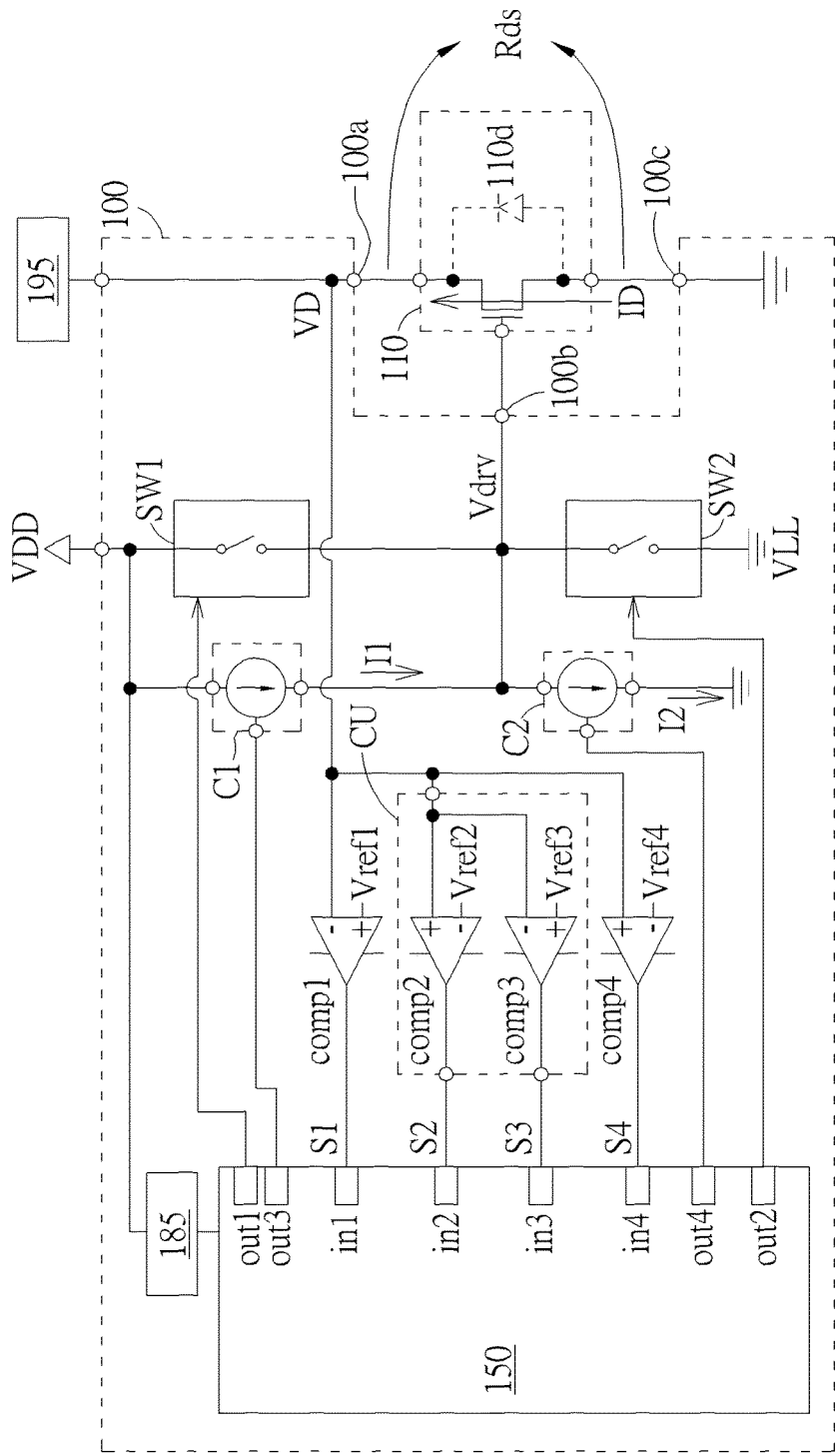
FIG. 2 illustrates a driving controller according to an embodiment.

FIG. 2 illustrates a driving controller 100 according to an embodiment. The driving controller 100 may be used to drive a transistor 100. The driving controller 100 may include a first operation unit SW1, a second operation unit SW2, a first adjustment unit C1, a second adjustment unit C2, a first comparator comp1, a comparison unit CU, and a fourth comparator comp4. The transistor 110 may include a first terminal, a second terminal and a control terminal. For example, the transistor 110 may be a power switch. For example, if the transistor 110 is an N-type MOSFET, the first terminal may be a drain terminal, the second terminal may be a source terminal, and the control terminal may be a gate terminal. The first terminal of the transistor 110 may be used to receive an operation voltage VD, and a current flowing through the transistor 110 may be an operation current ID. If setting a voltage at the second terminal of the transistor 110 as a baseline, the operation voltage VD may be a voltage across the first terminal and the second terminal of the transistor 110. The first operation unit SW1 may include a first terminal coupled to a first voltage terminal for receiving a first voltage VDD, a control terminal, and a second terminal coupled to the control terminal of the transistor 110. The second operation unit SW2 may include a first terminal coupled to the control terminal of the transistor, a control terminal, and a second terminal coupled to a second voltage terminal for receiving a second voltage VLL. The second voltage VLL may be lower than the first voltage VDD. The first voltage terminal may be a high voltage terminal, and the second voltage terminal may be a ground terminal. The first operation unit SW1 and the second operation unit SW2 may be a first switch and a second switch respectively, or other controllable operation units. The first adjustment unit C1 may be coupled to the control terminal of the transistor 110 and used to increase a voltage at the control terminal of the transistor 110. For example, as shown in FIG. 2, the first adjustment unit C1 may be a current source used to adjust and increase the voltage at the control terminal of the transistor 110. The second adjustment unit C2 may be coupled to the control terminal of the transistor 110 and used to decrease the voltage at the control terminal of the transistor 110. For example, as shown in FIG. 2, the second adjustment unit C2 may be another current source. The first adjustment unit C1 and the second adjustment unit C2 being current sources as shown in FIG. 2 is merely an example. According to other embodiments, each of the first adjustment unit C1 and the second adjustment unit C2 may be a controllable circuit unit formed with a set of resistors and/or transistors.

The first comparator comp1 may include a first terminal coupled to the first terminal of the transistor 110 for receiving the operation voltage VD, a second terminal for receiving a first reference voltage Vref1, and an output terminal for outputting a first comparison signal S1 when the operation voltage VD is equal to the first reference voltage Vref1. The comparison unit CU may include a first terminal coupled to the first terminal of the transistor for receiving the operation voltage VD, and a set of output terminals including one output terminal or a plurality of output terminals. The comparison unit CU may be used to compare the operation voltage VD and a second reference voltage Vref2 and compare the operation voltage VD and a third reference voltage Vref3. The set of output terminals of the comparison unit CU may output a second comparison signal S2 when the operation voltage VD is equal to the second reference voltage Vref2. The set of output terminals of the comparison unit CU may output a third comparison signal S3 when the operation voltage VD is equal to the third reference voltage Vref3.

According to an embodiment, the comparison unit CU may include one comparator or a plurality of comparators for performing comparison with a plurality of reference voltages. The comparison unit CU may compare the operation voltage VD with two reference voltages. When the comparison unit CU includes one single comparator, the comparator may be a Schmitt trigger comparator providing hysteresis so as to perform comparison with two reference voltages. According to another embodiment, as shown in FIG. 2, the comparison unit CU may include a second comparator comp2 and a third comparator comp3 for performing comparison with two reference voltages. The second comparator comp2 may include a first terminal coupled to the first terminal of the transistor 110 for receiving the operation voltage VD, a second terminal for receiving the second reference voltage Vref2, and an output terminal coupled to at least one output terminal of the set of output terminals of the comparison unit CU for outputting the second comparison signal S2 when the operation voltage VD is equal to the second reference voltage Vref2. The third comparator comp3 may include a first terminal coupled to the first terminal of the transistor 110 for receiving the operation voltage VD, a second terminal for receiving the third reference voltage Vref3, and an output terminal coupled to at least one output terminal of the set of output terminals of the comparison unit CU for outputting the third comparison signal S3 when the operation voltage is equal to the third reference voltage Vref3. The fourth comparator comp4 may include a first terminal coupled to the first terminal of the transistor 110 for receiving the operation voltage VD, a second terminal for receiving a fourth reference voltage Vref4, and an output terminal for outputting a fourth comparison signal S4 when the operation voltage VD is equal to the fourth reference voltage Vref4.

As shown in FIG. 2, the driving controller 100 may further include a logic control unit 150, and the logic control unit 150 may include a first input terminal in1, a set of functional input terminals, a fourth input terminal in4, and a first output terminal ou1 to a fourth output terminal out4. The first input terminal in1 may be coupled to the output terminal of the first comparator comp1. The set of functional input terminals may be correspondingly coupled to the set of output terminals of comparison unit CU. In an embodiment of the comparison unit CU having the second comparator comp2 and the third comparator comp3, the set of functional input terminals may include a second input terminal in2 and a third input terminal in3, where the second input terminal in2 is coupled to the output terminal of the second comparator comp2, and the third input terminal in3 is coupled to the output terminal of the third comparator comp3. The fourth input terminal in4 may be coupled to the output terminal of the fourth comparator comp4. The first output terminal out1 may be coupled to the control terminal of the first operation unit SW1 for turning on or turning off the first operation unit SW1. The second output terminal out2 may be coupled to the control terminal of the second operation unit SW2 for turning on or turning off the second operation unit SW2. The third output terminal out3 may be coupled to the first adjustment unit C1 for controlling the first adjustment unit C1 to increase the voltage at the control terminal of the transistor 110. The fourth output terminal out4 may be coupled to the second adjustment unit C2 for controlling the second adjustment unit C2 to decrease the voltage at the control terminal of the transistor 110. The driving controller 100 may further include a bias voltage unit 185 coupled between the logic control unit 150 and the first voltage terminal providing the first voltage VDD. The first terminal of the transistor 110 may be coupled to a coil unit 195. The coil unit 195 may include a transformer winding of an electrical power conversion circuit. The driving controller 100 may be (but not limited to) an integrated circuit (IC) or a part of an IC. Circuit interfaces 100a, 100b and 100c may be interfaces between the driving controller 100 and the transistor 110. For example, the circuit interfaces 100a, 100b and 100c may be pins or circuit nodes of an IC.

Figure 3:
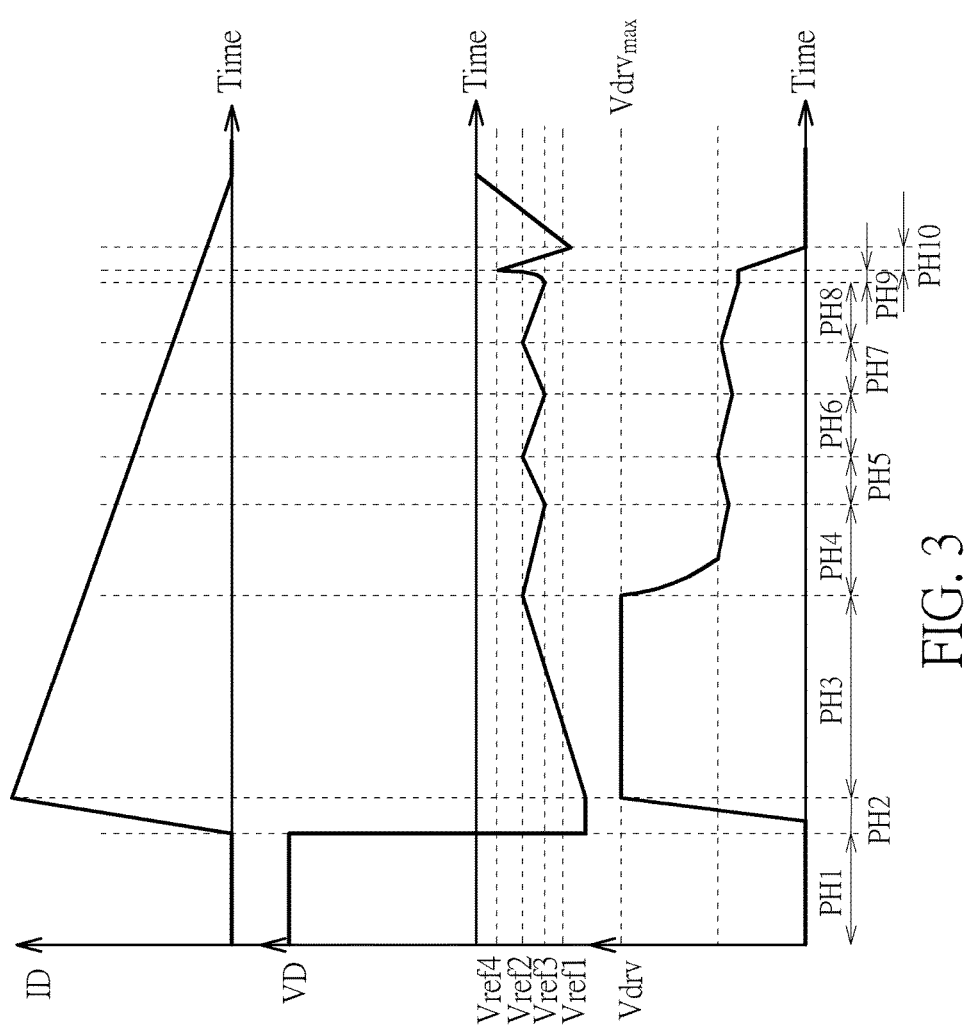
FIG. 3 illustrates currents and voltages of the driving controller of FIG. 2 according to an embodiment.

FIG. 3 illustrates currents and voltages of the driving controller 100 according to an embodiment. As shown in FIG. 3, the first reference voltage Vref1, the second reference voltage Vref2, the third reference voltage Vref3 and the fourth reference voltage Vref4 may be negative voltages.

As shown in FIG. 2 and FIG. 3, after entering phase PH2 from phase PH1, a body diode 110d may switch to be conductive. When the operation voltage VD is decreased to the first reference voltage Vref1 (e.g. −150 mV (millivolts)), the first operation unit SW1 may be turned on by the first comparison signal S1 outputted from the first output terminal out1 of the logic control unit 150. The voltage Vdrv at the control terminal (e.g. a gate terminal) of the transistor 110 may increase to further turn on the transistor 110. As shown in phase PH2, the voltage Vdrv may increase to a maximum $Vdrv_{max}$ (e.g. 10 volt) to make the transistor 110 more conductive. During phase PH3 following phase PH2, when the operation current ID decreases, the operation voltage VD may change to 0 volts. Because the operation voltage VD is a negative voltage in this phase, the operation voltage VD may increase.

When the operation voltage VD is increased to the second reference voltage Vref2 (e.g. −26 mV), the status may enter phase PH4 following phase PH3. The second adjustment unit C2 may be turned on by the fourth output terminal out4 of the logic control unit 150 according to the second comparison signal S2, and the second adjustment unit C2 may decrease the voltage Vdrv at the control terminal of the transistor 110. The conductivity of the transistor 110 may be reduced, and the on-resistance Rds may be increased. The operation voltage VD may decrease from the second reference voltage Vref2.

When the operation voltage VD is decreased to the third reference voltage Vref3 (e.g. −33 mV), the status may enter phase PH5 following phase PH4. The first adjustment unit C1 may be turned on by the third output terminal out3 of the logic control unit 150 according to the comparison signal S3. The first adjustment unit C1 may increase the voltage Vdrv at the control terminal of the transistor 110. Because the voltage Vdrv is increased, the on-resistance Rds of the transistor 110 may decrease, and the operation voltage VD may increase.

When the operation voltage VD is increased to the second reference voltage Vref2, the status may enter phase PH6 following phase PH5. The operation in phase PH6 may be similar to the operation in phase PH4. The second adjustment unit C2 may be turned on by the logic control unit 150. The second adjustment unit C2 may decrease the voltage Vdrv at the control terminal of the transistor 110, and the operation voltage VD may decrease.

When the operation voltage VD is decreased to the third reference voltage Vref3, the status may enter phase PH7 following phase PH6. The operation in phase PH7 may be similar to the operation in phase PH5. The first adjustment unit C1 may be turned on by the logic control unit 150. The first adjustment unit C1 may increase the voltage Vdrv at the control terminal of the transistor 110, so the operation voltage VD may increase.

When the operation voltage VD is increased to the second reference voltage Vref2, the status may enter phase PH8 following phase PH7. The operation in phase PH8 may be similar to the operation in phase PH6, so it is not repeated herein. As shown in FIG. 3, by comparing the operation voltage VD with the second reference voltage Vref2 and the third reference voltage Vref3, the voltage Vdrv at the control terminal of the transistor 110 may be dynamically adjusted so as to keep the operation voltage VD between the second reference voltage Vref2 and the third reference voltage Vref3. As shown in FIG. 3, during phases PH4 to PH8, the number of times of adjusting the operation voltage VD is merely an example. The number of times of adjusting the operation voltage VD may vary according to different embodiments, but the goal is to keep the operation voltage VD between the second reference voltage Vref2 and the third reference voltage Vref3.

During phase PH9 following phase PH8, the operation current ID may decrease and approach to 0 amps, and the operation voltage VD may increase. When the operation voltage VD increases to the fourth reference voltage Vref4 (e.g. −5 mV), the status may enter phase PH10 following phase PH9. During phase PH10, the operation voltage VD may not be kept between the second reference voltage Vref2 and the third reference voltage Vref3. The second operation unit SW2 may be turned on by the second output terminal out2 of the logic control unit 150 according to the fourth comparison signal S4 for the control terminal of the transistor 110 to receive the second voltage VLL. Since the voltage Vdrv is pulled down to the second voltage VLL, the transistor 110 may be turned off. The duration of phase PH10 may be the time for turning off the transistor 110. The voltage of the control terminal of the transistor is pulled down from a maximum voltage according to prior art. However, the voltage Vdrv may be pulled down from a level lower than half the maximum voltage (e.g. 5 volt) during phase PH10 of FIG. 3, and the time for turning off the transistor 110 may be reduced to speed up the operation of the circuit.

According to an embodiment, the first adjustment unit C1 and the second adjustment unit C2 may not be turned on at the same time substantially. In addition, the first operation unit SW1 and the second operation unit SW2 may not be turned on at the same time substantially. The first reference voltage Vref1 to the fourth reference voltage Vref4 may be negative voltage. The first reference voltage Vref1 may be lower than the third reference voltage Vref3. The third reference voltage Vref3 may be lower than the second reference voltage Vref2. The second reference voltage Vref2 may be lower than the fourth reference voltage Vref4. For example, the first reference voltage Vref1, the second reference voltage Vref2, the third reference voltage Vref3 and the fourth reference voltage Vref4 may be (but not limited to) −150 mV, −26 mV, −33 mV and −5 mV respectively.

Figure 4:
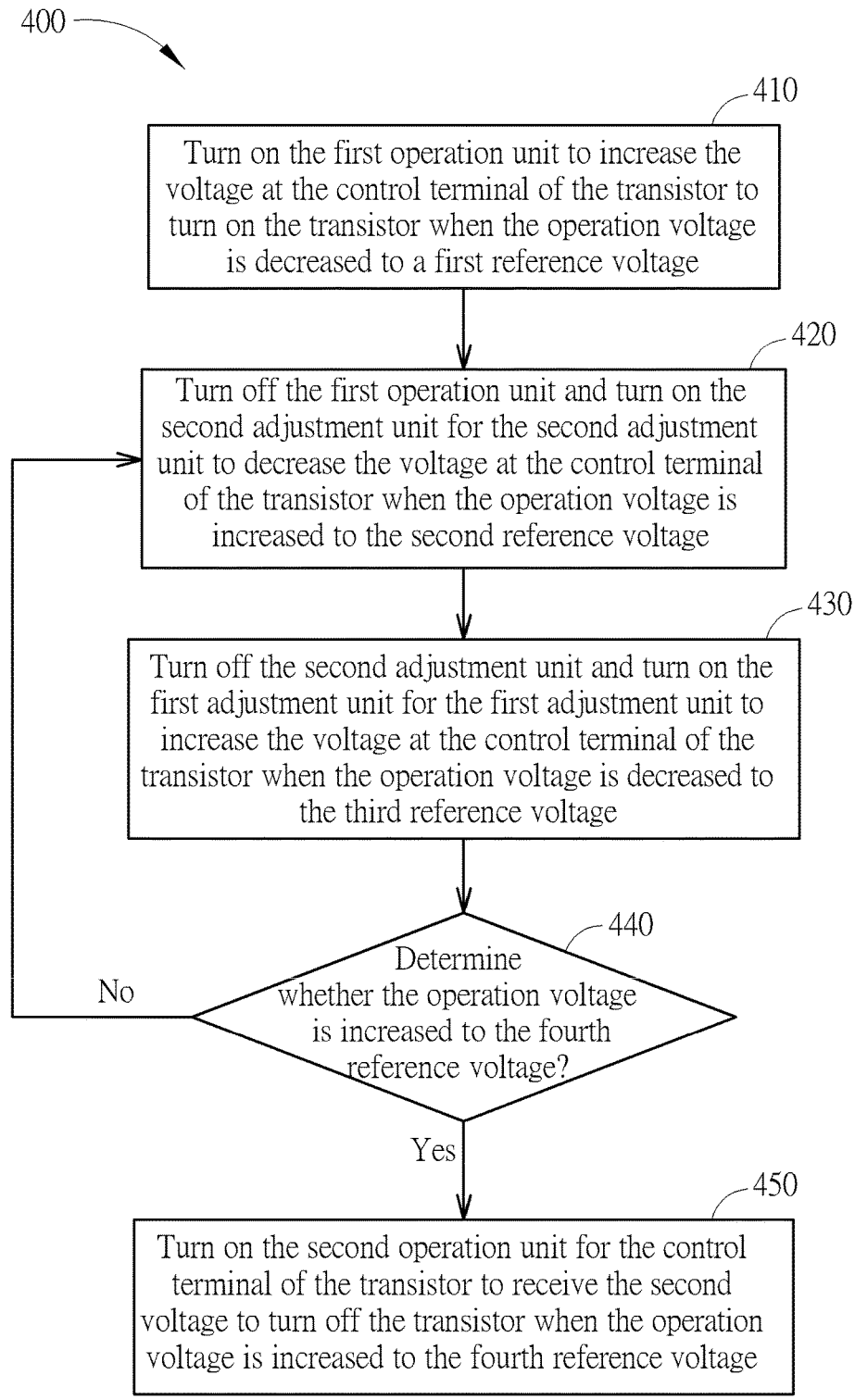
FIG. 4 illustrates a control method for the driving controller of FIG. 2 according to an embodiment.

FIG. 4 illustrates a control method 400 for the driving controller 100 according to an embodiment. As shown in FIG. 2, FIG. 3 and FIG. 4, the control method 400 may include following steps.

Step 410: turn on the first operation unit SW1 to increase the voltage Vdrv at the control terminal of the transistor 110 to turn on the transistor 110 when the operation voltage VD is decreased to a first reference voltage Vref1;

Step 420: turn off the first operation unit SW1 and turn on the second adjustment unit C2 for the second adjustment unit C2 to decrease the voltage Vdrv at the control terminal of the transistor 110 when the operation voltage VD is increased to the second reference voltage Vref2;

Step 430: turn off the second adjustment unit C2 and turn on the first adjustment unit C1 for the first adjustment unit C1 to increase the voltage Vdrv at the control terminal of the transistor 110 when the operation voltage VD is decreased to the third reference voltage Vref3;

Step 440: determine whether the operation voltage VD is increased to the fourth reference voltage Vref4? If so, enter Step 450; else enter Step 420; and Step 450: turn on the second operation unit SW2 for the control terminal of the transistor to receive the second voltage VLL to turn off the transistor 110 when the operation voltage VD is increased to the fourth reference voltage Vref4.

Step 410 may correspond to phase PH2 of FIG. 3. Step 420 and Step 430 may correspond to phases PH3 to PH8 of FIG. 3. Step 440 and Step 450 may correspond to phases PH9 and PH10 of FIG. 3.

In summary, by means of the driving controller 100 and the control method 400, the voltage Vdrv at the control terminal of the transistor 110 may be dynamically adjusted before the operation current ID decreases to 0 amps. According to embodiments, the time for turning off the transistor may be reduced. Hence, the effect and the operation speed of the circuit may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving controller configured to drive a transistor, the transistor comprising a first terminal for receiving an operation voltage, a second terminal and a control terminal, the driving controller comprising:
    a first operation unit comprising a first terminal for receiving a first voltage, a control terminal, and a second terminal coupled to the control terminal of the transistor;
    a first adjustment unit coupled to the control terminal of the transistor and configured to increase a voltage at the control terminal of the transistor;
    a second adjustment unit coupled to the control terminal of the transistor and configured to decrease the voltage at the control terminal of the transistor;
    a first comparator comprising a first terminal coupled to the first terminal of the transistor, a second terminal for receiving a first reference voltage, and an output terminal for outputting a first comparison signal when the operation voltage is equal to the first reference voltage; and
    a comparison unit comprising a first terminal coupled to the first terminal of the transistor to receive the operation voltage, and a set of output terminals, wherein the comparison unit is configured to compare the operation voltage and a second reference voltage and compare the operation voltage and a third reference voltage, the set of output terminals outputs a second comparison signal when the operation voltage is equal to the second reference voltage, and the set of output terminals outputs a third comparison signal when the operation voltage is equal to the third reference voltage.

2. The driving controller of claim 1 further comprising:
    a second operation unit comprising a first terminal coupled to the control terminal of the transistor, a control terminal, and a second terminal for receiving a second voltage;
    wherein the second voltage is lower than the first voltage.

3. The driving controller of claim 2, wherein the first operation unit is a first switch and the second operation unit is a second switch.

4. The driving controller of claim 1, wherein the first adjustment unit is a first current source, and the second adjustment unit is a second current source.

5. The driving controller of claim 1 further comprising:
    a fourth comparator comprising a first terminal coupled to the first terminal of the transistor, a second terminal for receiving a fourth reference voltage, and an output terminal for outputting a fourth comparison signal when the operation voltage is equal to the fourth reference voltage; and
    a second operation unit comprising a first terminal coupled to the control terminal of the transistor, a control terminal, and a second terminal for receiving a second voltage lower than the first voltage;
    wherein the driving controller further comprises a logic control unit, and the logic control unit comprises:
    a first input terminal coupled to the output terminal of the first comparator;
    a set of functional input terminals correspondingly coupled to the set of output terminals of comparison unit;
    a fourth input terminal coupled to the output terminal of the fourth comparator;
    a first output terminal coupled to the control terminal of the first operation unit for turning on or turning off the first operation unit;
    a second output terminal coupled to the control terminal of the second operation unit for turning on or turning off the second operation unit;
    a third output terminal coupled to the first adjustment unit for controlling the first adjustment unit to increase a voltage at the control terminal of the transistor; and
    a fourth output terminal coupled to the second adjustment unit for controlling the second adjustment unit to decrease the voltage at the control terminal of the transistor.

6. The driving controller of claim 5, wherein the first operation unit is turned on by the first output terminal of the logic control unit to increase the voltage at the control terminal of the transistor when the operation voltage decreases to the first reference voltage.

7. The driving controller of claim 5, wherein the second adjustment unit is turned on by the fourth output terminal of the logic control unit to decrease the voltage at the control terminal of the transistor when the operation voltage increases to the second reference voltage, and the first reference voltage is lower than the second reference voltage.

8. The driving controller of claim 5, wherein the first adjustment unit is turned on by the third output terminal of the logic control unit to increase the voltage at the control terminal of the transistor when the operation voltage decreases to the third reference voltage, the first reference voltage is lower than the third reference voltage, and the third reference voltage is lower than the second reference voltage.

9. The driving controller of claim 5, wherein the second operation unit is turned on by the second output terminal of the logic control unit for the control terminal of the transistor to receive the second voltage to turnoff the transistor when the operation voltage increases to the fourth reference voltage.

10. The driving controller of claim 5, wherein the first reference voltage is lower than the third reference voltage, the third reference voltage is lower than the second reference voltage, the second reference voltage is lower than the fourth reference voltage, and the first reference voltage, the second reference voltage, the third reference voltage and the fourth reference voltage are negative voltages.

11. The driving controller of claim 1, wherein the comparison unit further comprises:
a second comparator comprising a first terminal coupled to the first terminal of the comparison unit, a second terminal for receiving the second reference voltage, and an output terminal coupled to at least one output terminal of the set of output terminals of the comparison unit for outputting the second comparison signal when the operation voltage is equal to the second reference voltage; and
a third comparator comprising a first terminal coupled to the first terminal of the comparison unit, a second terminal for receiving the third reference voltage, and an output terminal coupled to at least one output terminal of the set of output terminals of the comparison unit for outputting the third comparison signal when the operation voltage is equal to the third reference voltage.

12. The driving controller of claim 11, further comprising:
a fourth comparator comprising a first terminal coupled to the first terminal of the transistor, a second terminal for receiving a fourth reference voltage, and an output terminal for outputting a fourth comparison signal when the operation voltage is equal to the fourth reference voltage; and
a second operation unit comprising a first terminal coupled to the control terminal of the transistor, a control terminal, and a second terminal for receiving a second voltage lower than the first voltage;
wherein the driving controller further comprises a logic control unit, and the logic control unit comprises:
a first input terminal coupled to the output terminal of the first comparator;
a second input terminal coupled to the output terminal of the second comparator;
a third input terminal coupled to the output terminal of the third comparator;
a fourth input terminal coupled to the output terminal of the fourth comparator;
a first output terminal coupled to the control terminal of the first operation unit for turning on or turning off the first operation unit;
a second output terminal coupled to the control terminal of the second operation unit for turning on or turning off the second operation unit;
a third output terminal coupled to the first adjustment unit for controlling the first adjustment unit to increase a voltage at the control terminal of the transistor; and
a fourth output terminal coupled to the second adjustment unit for controlling the second adjustment unit to decrease the voltage at the control terminal of the transistor.

13. The driving controller of claim 1, wherein the first adjustment unit and the second adjustment unit are substantially not turned on concurrently.

14. A control method for a driving controller, the driving controller being configured to drive a transistor, the transistor comprising a first terminal for receiving an operation voltage, the driving controller comprising a first operation unit coupled between a control terminal of the transistor and a first voltage terminal providing a first voltage, a first adjustment unit coupled to the control terminal of the transistor, and a second adjustment unit coupled to the control terminal of the transistor, the control method comprising:
turning on the first operation unit to increase a voltage at the control terminal of the transistor to turn on the transistor when the operation voltage decreases to a first reference voltage;
turning off the first operation unit and turning on the second adjustment unit for the second adjustment unit to decrease the voltage at the control terminal of the transistor when the operation voltage increases to a second reference voltage;
turning off the second adjustment unit and turning on the first adjustment unit for the first adjustment unit to increase the voltage at the control terminal of the transistor when the operation voltage decreases to a third reference voltage;
wherein the first adjustment unit and the second adjustment unit are not turned on concurrently, the first reference voltage is lower than the third reference voltage, and the third reference voltage is lower than the second reference voltage.

15. The control method of claim 14, wherein the driving controller further comprises a second operation unit coupled between the control terminal of the transistor and a second voltage terminal providing a second voltage lower than the first voltage, and the control method further comprises:
turning on the second operation unit for the control terminal of the transistor to receive the second voltage to turn off the transistor when the operation voltage increases to a fourth reference voltage;
wherein the second reference voltage is lower than the fourth reference voltage, and the first reference voltage, the second reference voltage, the third reference voltage and the fourth reference voltage are negative voltages.

* * * * *